US012727099B2

(12) United States Patent
Tsorng et al.

(10) Patent No.: US 12,727,099 B2
(45) Date of Patent: Sep. 1, 2026

(54) MOUNTING LATCH AND MOUNTING SYSTEM FOR SERVER EAR

(71) Applicant: Quanta Computer Inc., Taoyuan City (TW)

(72) Inventors: Yaw-Tzorng Tsorng, Taoyuan City (TW); Tung-Hsien Wu, Taoyuan City (TW); Guan-Kai Lien, Taoyuan City (TW); Ping-Hsuan Chen, Taoyuan City (TW)

(73) Assignee: Quanta Computer Inc., Taoyuan City (TW)

( * ) Notice: Subject to any disclaimer, the term of this patent is extended or adjusted under 35 U.S.C. 154(b) by 104 days.

(21) Appl. No.: 18/805,041

(22) Filed: Aug. 14, 2024

(65) Prior Publication Data

US 2026/0052636 A1 Feb. 19, 2026

(51) Int. Cl.
*G06F 1/16* (2006.01)
*H05K 5/00* (2025.01)
(Continued)

(52) U.S. Cl.
CPC ......... *H05K 5/0221* (2013.01); *H05K 5/0226* (2013.01); *H05K 7/1409* (2013.01)

(58) Field of Classification Search
CPC .. H05K 5/0221; H05K 5/0226; H05K 5/0217; H05K 5/023; H05K 7/1409;
(Continued)

(56) References Cited

U.S. PATENT DOCUMENTS 8,503,184 B2 * 8/2013 Hanna ..................... G06F 1/186 361/747
9,743,549 B2 * 8/2017 Jiang .................... H05K 7/1492
(Continued)

FOREIGN PATENT DOCUMENTS

CN 201294684 Y 8/2009
CN 201819276 U 5/2011
(Continued)

OTHER PUBLICATIONS

TW Office Action for Application No. 113141197 mailed Mar. 24, 2025, w/ First Office Action Summary, 7 pp.
(Continued)

*Primary Examiner* — Anthony M Haughton
(74) *Attorney, Agent, or Firm* — Nixon Peabody LLP

(57) ABSTRACT

A mounting system includes a first bracket and a second bracket connected together by a hinge. The hinge is configured to allow the second bracket to rotate relative to the first bracket. The mounting system further includes a mounting latch that has an anchor attached to the second bracket, a rail attached to the first bracket, a rigid arm connected to the anchor, and a lever within the rail. The lever is connected to the anchor by the rigid arm. The lever is configured to translate within the rail between a first position, which positions the rigid arm relative to the anchor so that the second bracket can rotate to be planar to the first bracket, and a second position, which positions the rigid arm relative to the anchor so that rigid arm secures the second bracket to be perpendicular to the first bracket.

20 Claims, 11 Drawing Sheets

(51) Int. Cl.
*H05K 5/02* (2006.01)
*H05K 7/00* (2006.01)
*H05K 7/14* (2006.01)

(58) Field of Classification Search
CPC .. H05K 7/1408; H05K 7/1405; H05K 7/1402; H05K 7/1401
See application file for complete search history.

(56) References Cited

U.S. PATENT DOCUMENTS

| | | | | |
|---|---|---|---|---|
| 10,863,647 | B1 * | 12/2020 | Escamilla | H05K 5/023 |
| 11,197,384 | B1 * | 12/2021 | Chang | H05K 7/1401 |
| 12,048,113 | B2 * | 7/2024 | Mao | H05K 7/1489 |
| 2011/0266933 | A1 * | 11/2011 | Hanna | G06F 1/186 70/58 |
| 2018/0139856 | A1 * | 5/2018 | Oneufer | H02B 1/16 |
| 2018/0220544 | A1 * | 8/2018 | Wang | H05K 7/1402 |
| 2021/0385962 | A1 * | 12/2021 | Chang | H05K 7/1409 |
| 2022/0418139 | A1 * | 12/2022 | Wang | G06F 1/187 |
| 2023/0225072 | A1 * | 7/2023 | Zhong | H05K 7/1401 211/26.2 |
| 2025/0133676 | A1 * | 4/2025 | Lench | G06F 1/187 |

FOREIGN PATENT DOCUMENTS

| | | |
|---|---|---|
| CN | 204810746 U | 11/2015 |
| CN | 207720569 U | 8/2018 |
| CN | 217129226 U | 8/2022 |

OTHER PUBLICATIONS

TW Search Report for Application No. 113141197 mailed Mar. 24, 2025 w/ First Office Action, 1 p.

* cited by examiner

MOUNTING LATCH AND MOUNTING SYSTEM FOR SERVER EAR

FIELD OF THE INVENTION

The present invention relates generally to mounting ears, and more specifically, to a mechanism that allows the mounting ears to be foldable.

BACKGROUND OF THE INVENTION

In general, the front panel of a server, such as a blade server, is designed with mounting ears to secure it to the server rack. Handles and printed circuit boards (PCBs) can also be installed on these mounting ears to provide users with functions and controls.

FIG. 1 shows one example of a conventional mounting ear 100. The mounting ear 100 includes a handle 102 and a cap 104 that covers a printed circuit board (PCB) 104, which can include one or more controls and/or one or more interfaces, such as a universal serial bus (USB). The mounting ear 100 connects to a server via the bracket 106, which also connects to the handle 102 and the cap 104. FIG. 2 shows the mounting ear 100 connected to a chassis 200 of a server 202.

To meet the increasing demands for higher efficiency, servers need to be installed in an immersion cooling system. However, due to the different heat dissipation requirements of the hot and cold aisles, the immersion cooling systems typically need to be installed from top to bottom. The entrance of these immersion cooling tanks are typically designed with a stopper to prevent the server from falling into the tanks and becoming inaccessible. Conventional mounting ears cannot pass through the width of this stopper because the mounting ears extend by a dimension W1 in FIG. 2 beyond the width of the chassis 200 on both sides. Only by reducing the width of the server 202 can the mounting ears enter the immersion cooling tank and be successfully installed.

Accordingly, the present application discloses a mounting latch and a mounting system that provide foldable mounting ears.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a mounting system is disclosed. The mounting system includes a first bracket rotatably connected to a second bracket via a hinge. The mounting system further includes an anchor attached to the second bracket and a rail attached to the first bracket. The mounting system further includes a rigid arm connected to the anchor. The mounting system further includes a lever positioned within the rail and connected to the anchor via the rigid arm. The lever is configured to translate within the rail between a first position and a second position. The rigid arm is positioned in the first position relative to the anchor such that the second bracket can rotate to a planar position relative to the first bracket. The rigid arm is positioned in the second position relative to the anchor such that the rigid arm secures the second bracket in a perpendicular position relative to the first bracket.

Further aspects of the mounting system include the rail having a first aperture and a second aperture. The first aperture is closer to the anchor than the second aperture. The lever includes a projection that is configured to selectively extend through the first aperture and the second aperture. The projection extending through the first aperture secures the lever in the first position, and the projection extending through the second aperture secures the lever in the second position. According to some implementations, the lever includes two legs upon which the lever rides within the rail. The two legs act as a fulcrum when depressing the projection.

Further aspects of the mounting system include the first bracket having a first cylindrical hole, and the second bracket having a second cylindrical hole. The mounting system further includes a pin slotted through the first cylindrical hole and the second cylindrical hole to form the hinge.

Further aspects of the mounting system include a pair of fasteners configured to secure the pin within the hinge.

Further aspects of the mounting system include the first bracket having a right-angled projection configured to abut against the second bracket. The right-angled projection limits rotation of the second bracket relative to the first bracket.

Further aspects of the mounting system include the second bracket having a right-angled projection configured to abut against the first bracket. The right-angled projection limits rotation of the second bracket relative to the first bracket.

Further aspects of the mounting system include the first bracket having a planar projection configured to abut against the second bracket. The planar projection limits rotation of the second bracket relative to the first bracket.

Further aspects of the mounting system include the first bracket having one or more apertures that align with apertures on a chassis.

Further aspects of the mounting system include the second bracket having one or more apertures that align with apertures on a mounting ear.

Further aspects of the mounting system include a protection flange attached to the first bracket. The protection flange extends parallel to the rail and is taller than the lever within the rail.

According to certain aspects of the present disclosure, a computing system is disclosed. The computing system includes a blade server chassis, a mounting ear, and a mounting system coupling the mounting ear to the blade server chassis. The mounting system includes a first bracket connected to the blade server chassis. The mounting system further includes a second bracket connected to the mounting ear. The first bracket is connected to the second bracket to allow the second bracket to rotate relative to the first bracket such that the mounting ear is withdrawn within a width of the blade server chassis.

Further aspects of the computing system include the first bracket and the second bracket being connected together by a hinge. The hinge is configured to allow the second bracket to rotate relative to the first bracket.

Further aspects of the mounting system include a rail attached to the first bracket, a rigid arm connected to the anchor, and a lever within the rail that is connected to the anchor by the rigid arm.

Further aspects of the mounting system include the lever being configured to translate within the rail between a first position and a second position. The first position positioning the rigid arm relative to the anchor such that the second bracket can rotate to be planar to the first bracket. The second position positioning the rigid arm relative to the anchor such that rigid arm secures the second bracket to be perpendicular to the first bracket.

Further aspects of the mounting system include the rail having a first aperture and a second aperture. The first aperture is closer to the anchor than the second aperture. The lever includes a projection that is configured to selectively extend through the first aperture and the second aperture.

Further aspects of the mounting system include the second bracket having a right-angled projection configured to abut against the first bracket. The right-angled projection limits rotation of the second bracket relative to the first bracket.

Further aspects of the mounting system include the first bracket having a planar projection configured to abut against the second bracket. The planar projection limits rotation of the second bracket relative to the first bracket.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

DETAILED DESCRIPTION

Figure 1:
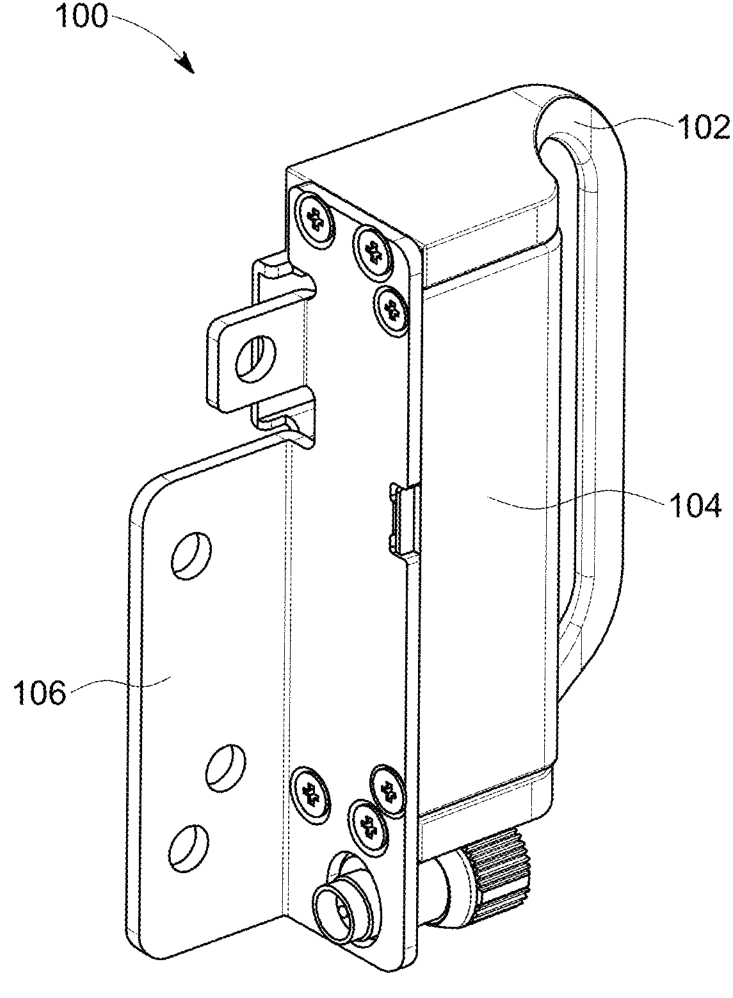
FIG. 1 is a perspective view of a conventional bracket for a mounting ear.
Figure 2:
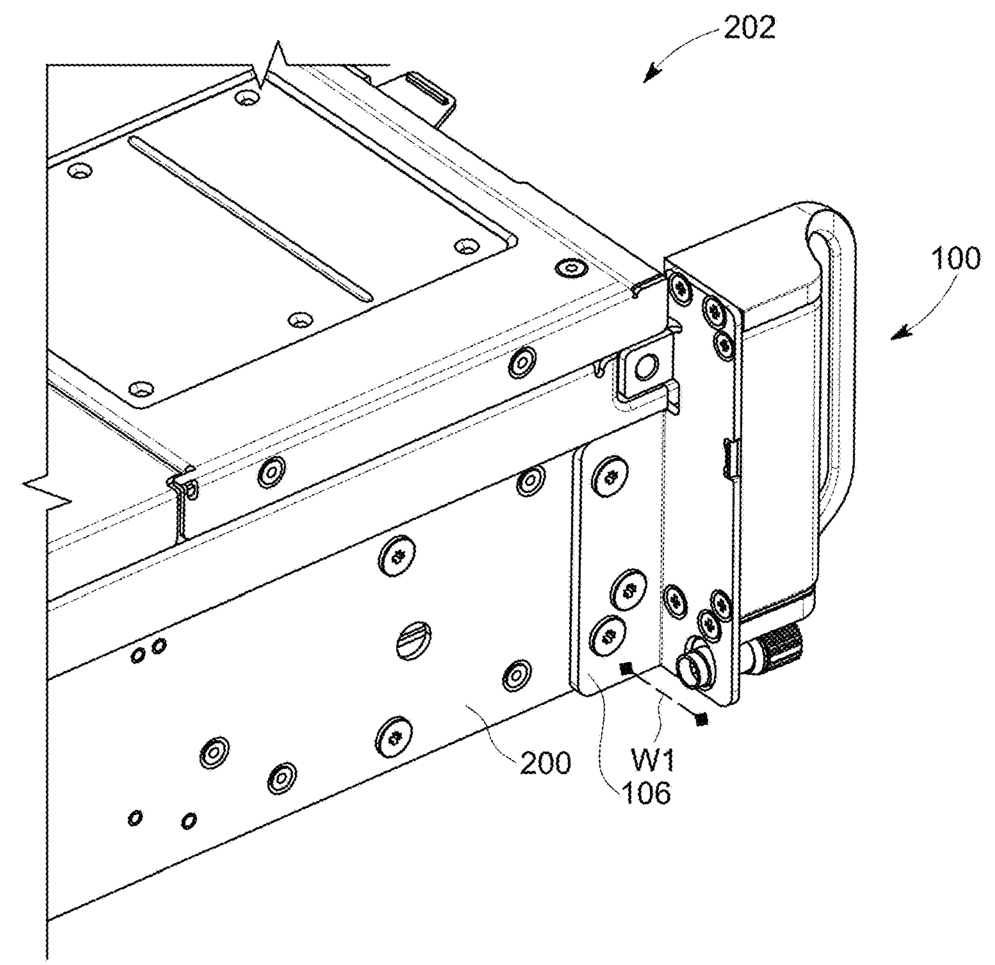
FIG. 2 is a perspective view of the conventional bracket of FIG. 1 attached to a chassis.

The present application discloses a mounting latch and a mounting system that couple a mounting ear to a chassis of a server, such as a blade server. The mounting latch and the mounting system allow the mounting ear to fold to reduce the width of the chassis. This provides for greater flexibility of the server and the mounting ear.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word “including” means “including without limitation.” Moreover, words of approximation, such as “about,” “almost,” “substantially,” “approximately,” and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Figure 3:
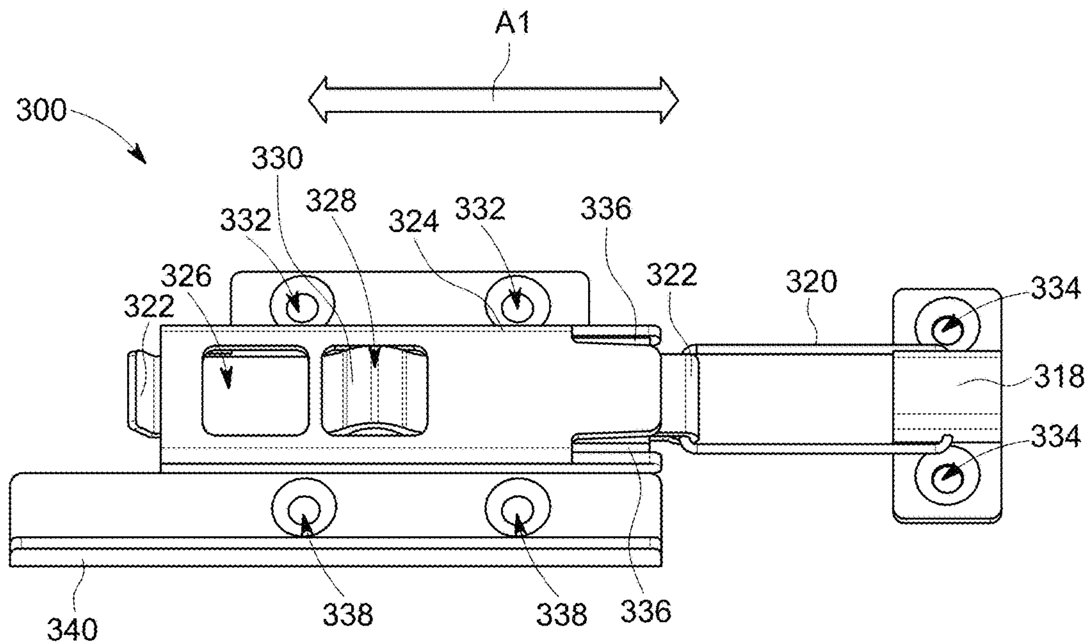
FIG. 3 is a perspective view of a mounting latch, according to aspects of the present disclosure.

FIG. 3 shows a mounting latch 300, according to aspects of the present disclosure. The mounting latch 300 includes a rail 324. A lever 322 sits within the rail 324. The lever 322 is configured to translate in the direction of arrow A1 in FIG. 3 within the rail 324. A rigid arm 320 is connected to the lever 322. The rigid arm 320 is also connected to an anchor 318.

The rail 324 includes an aperture 326 and an aperture 328. The lever 322 includes a projection 330 that extends up through the aperture 328, as shown in FIG. 3. The projection 330 is shaped so as to be retained within the apertures 326 and 328 unless depressed, as further disclosed below. The lever 322 translating in the rail 324 also allows for the projection 330 to extend through the aperture 326.

The rail 324 includes apertures 332 that allow fasteners to extend therethrough for fastening the rail 324 to a chassis of a server, as discussed further below. Similarly, the anchor 318 includes apertures 334 that allow fasteners to extend therethrough for fastening the anchor 318 to a bracket 406, as discussed further below. However, the rail 324 and the anchor 318 can lack the apertures 332 and 334, respectively, and be attached to a chassis of a server by other mechanisms, such as by adhesives, welds, etc.

According to some implementations, the mounting latch 300 can include a protection flange 340. The protection flange 340 extends parallel to the rail 324 and is taller than the lever 322. The protection flange 340 limits objects from impacting the rail 324 and/or the lever 322 with the mounting latch 300 attached to a server. Like the rail 324 and the anchor 318, the protection flange 340 can include apertures 338 that allow fasteners to extend therethrough for fastening the protection flange 340 to a chassis of a server.

The rail 324 includes slots 336 that allow the rigid arm 320 to extend through the rail 324 when the lever 322 is translated within the rail 324 so that the projection 328 extends through the aperture 326.

Figure 4:
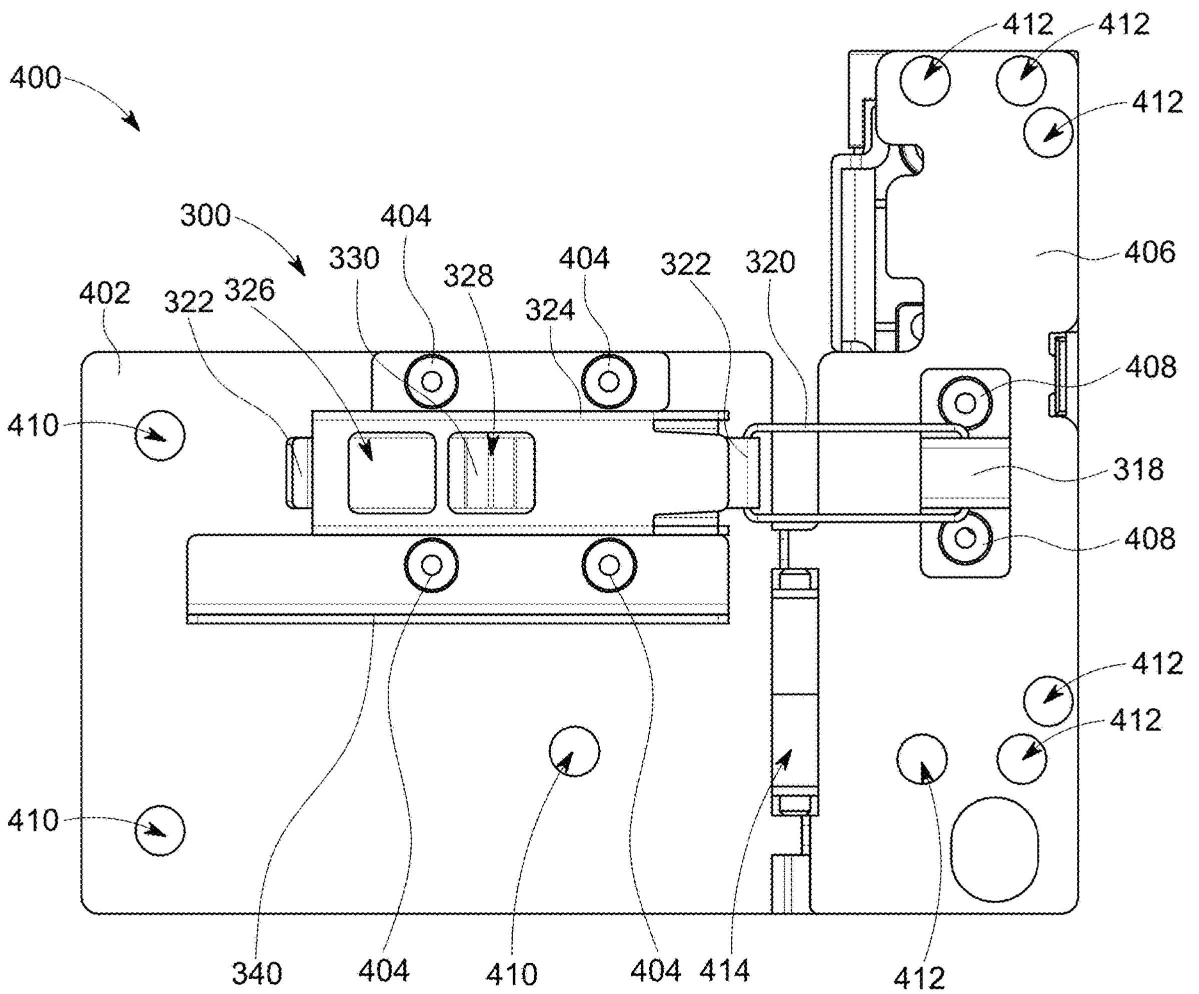
FIG. 4 is a side view of a mounting system, according to aspects of the present disclosure.

Referring to FIG. 4, a mounting system 400 is shown, according to aspects of the present disclosure. The mounting system 400 includes the mounting latch 300. The rail 324 is attached to a bracket 402. The rail 324 can be attached to the bracket 402 by fasteners 404, such as rivets, nails, screws, etc. The bracket 402 can include apertures 410 that can accept fasteners, such as rivets, nails, screws, etc., for securing the bracket 402 to a chassis of a server, as discussed further below. However, the bracket 402 can lack the apertures 410 and instead be attached to a chassis of a server by other mechanisms, such as by adhesives, welds, etc.

The mounting system 400 further includes a bracket 406. The anchor 318 is attached to the bracket 406. The anchor 318 can be attached to the bracket 406 by fasteners 408, such as rivets, nails, screws, etc. The bracket 406 can include apertures 412 that can accept fasteners, such as rivets, nails, screws, etc., for securing the bracket 406 to a chassis of a server, as discussed further below. However, the bracket 406 can lack the apertures 412 and be attached to a chassis of a server by other mechanisms, such as by adhesives, welds, etc.

The bracket 402 is connected to the bracket 406 by a hinge 414. The hinge 414 allows the bracket 406 to rotate relative to the bracket 402. The rigid arm 320 of the mounting latch 300 extends between the bracket 402 and the bracket 406.

Figure 5:
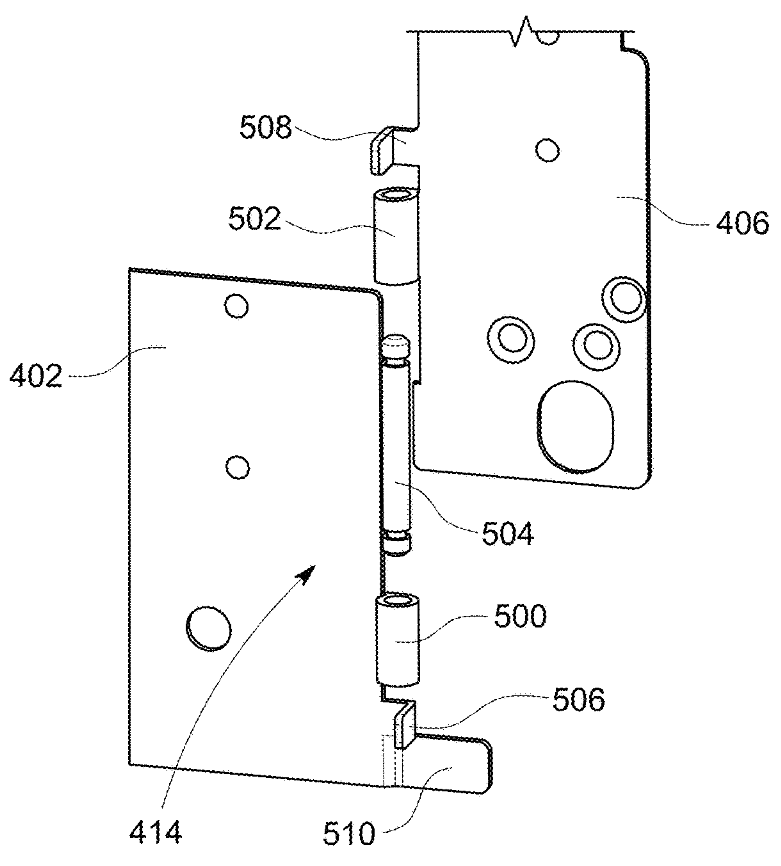
FIG. 5 is an exploded detailed view of a hinge of a mounting system, according to aspects of the present disclosure.

FIG. 5 shows a detailed exploded view hinge 414, according to aspects of the present disclosure. The hinge 414 is formed by the bracket 402 including a cylindrical projection 500, and by the bracket 406 including a cylindrical projection 502. A pin 504 is inserted into the cylindrical projection 500 and the cylindrical projection 502. The cylindrical projection 500 and the cylindrical projection 502 can rotate about the pin 504.

Figure 6:
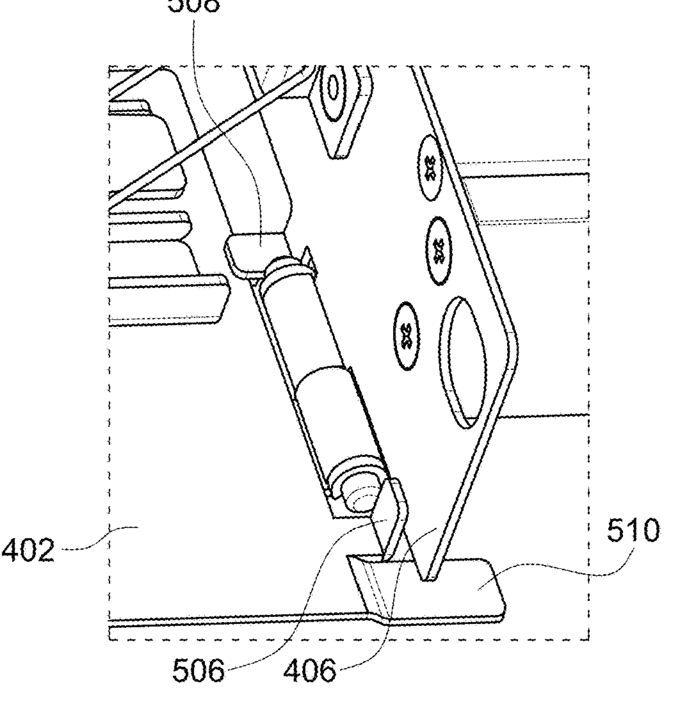
FIG. 6 shows a stage of operation of the mounting system, according to aspects of the present disclosure.

According to some implementations, the bracket 402 includes a right-angled projection 506 and the bracket 406 includes a right-angled projection 508. As shown in FIG. 6, the right-angled projections 506 and 508 can limit the rotational movement of the bracket 406 relative to the bracket 406. Specifically, the right-angled projection 506 contacts the bracket 406 to limit further rotation of the bracket 406 toward the bracket 402. The right-angled projection 508 contacts the bracket 402 to limit further rotation of the bracket 406 toward the bracket 402.

Figure 7:
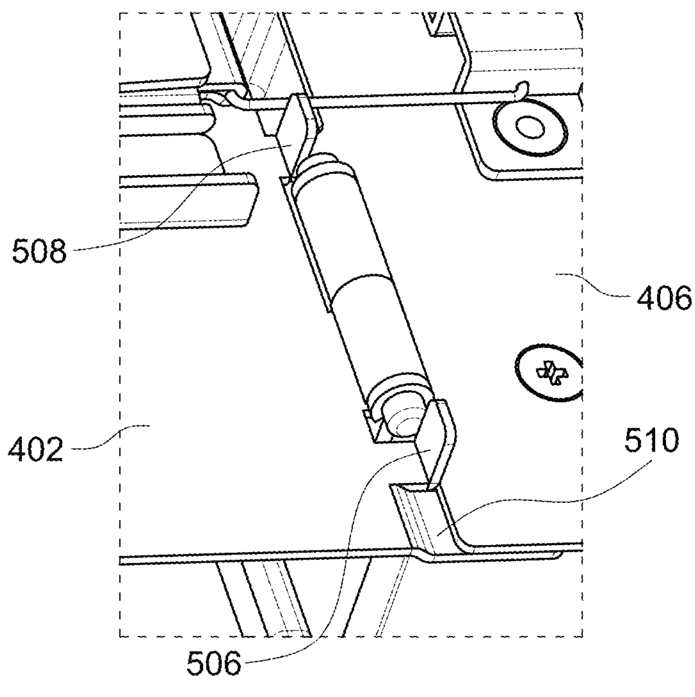
FIG. 7 shows another stage of operation of the mounting system, according to aspects of the present disclosure.

Referring back to FIG. 5, according to some implementations, the bracket 402 can include a planar projection 510. As shown in FIG. 7, the planar projection 510 can contact the bracket 406 to limit further rotation of the bracket 406 away from the bracket 402 (i.e., opposite to the direction of rotation discussed above for the right-angled projections 506 and 508).

Figure 8:
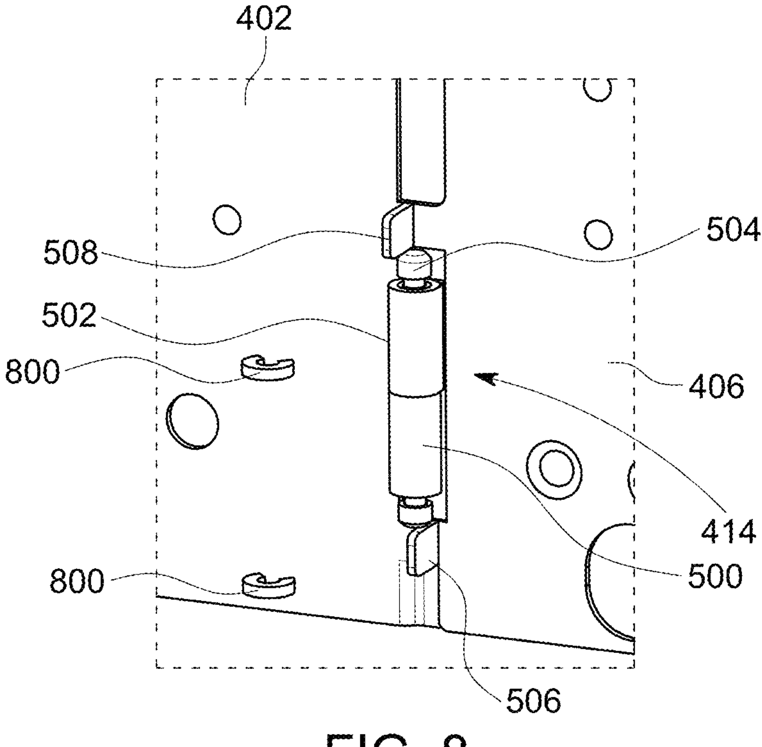
FIG. 8 shows a detailed view of the hinge of FIG. 5, according to aspects of the present disclosure.

Referring to FIG. 8, the pin 504 can be retained within the cylindrical projections 500 and 502 by clips 800. The clips 800 couple to the pin 504 on opposite sides of the cylindrical projections 500 and 502.

Figure 9:
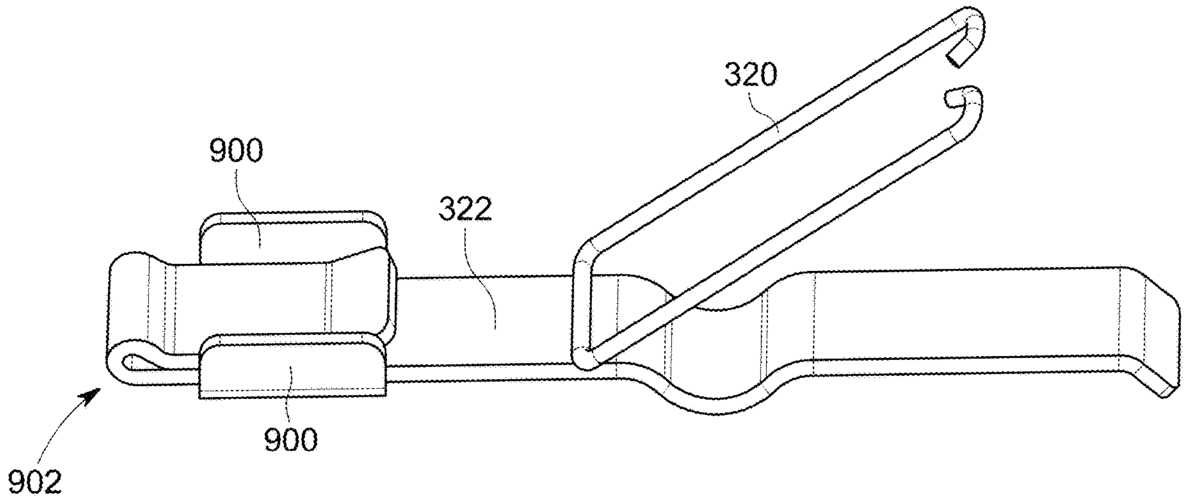
FIG. 9 shows a perspective view of a disassembled lever of the mounting latch of FIG. 3, according to aspects of the present disclosure.

Referring to FIG. 9, a standalone view of the lever 322 and rigid arm 320 is shown, according to aspects of the present disclosure. The lever 322 includes legs 900. The legs 900 allow the lever 322 to flex, as further disclosed below.

Figure 10:
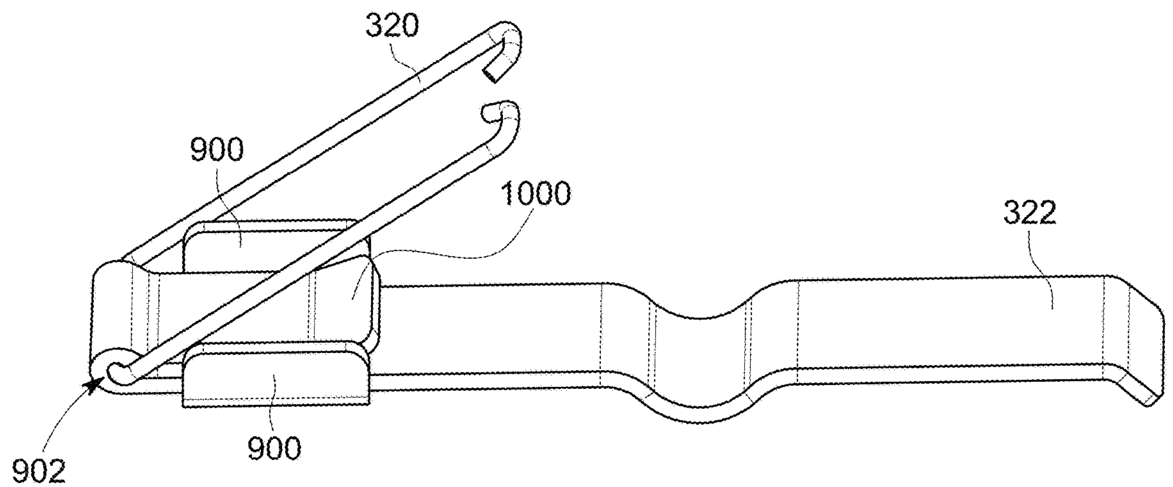
FIG. 10 shows a perspective view of an assembled lever of the mounting latch of FIG. 3, according to aspects of the present disclosure.

The lever 322 further includes a loop 902. The loop 902 allows the lever 322 to accept and retain the rigid arm 320. Specifically, as shown in FIG. 10, the rigid arm 320 fits within the loop 902. The lever 322 can include an angled lip 1000. The rigid arm 320 pressed against the angled lip 1000 causes the angled lip 1000 to flex, which allows the rigid arm 320 to access the loop 902. Once within the loop 902, tension of the angled lip 1000 retains the rigid arm 320 in the loop 902. The rigid arm 320 can rotate within the loop 902.

Figure 11:
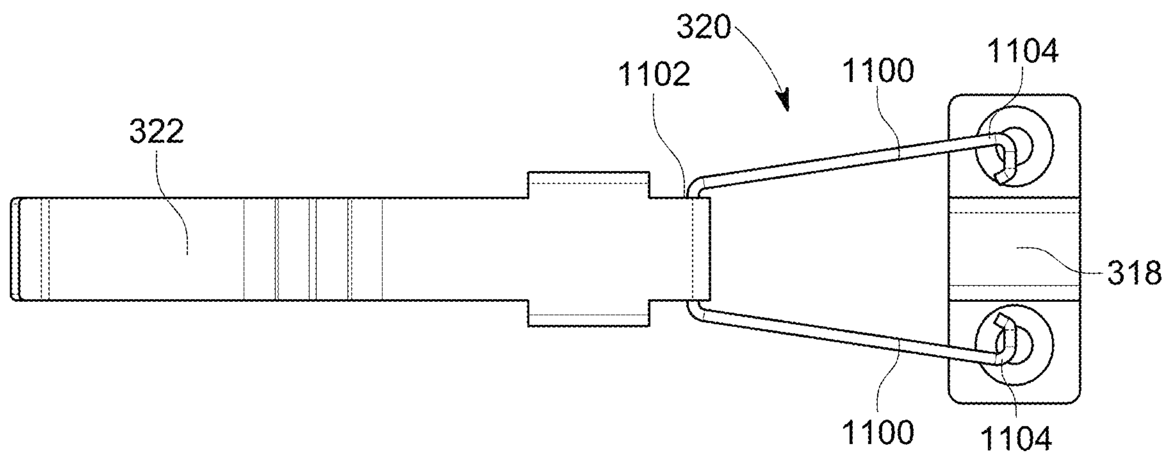
FIG. 11 shows a perspective view of the lever detached from the anchor of the mounting latch of FIG. 3, according to aspects of the present disclosure.
Figure 12:
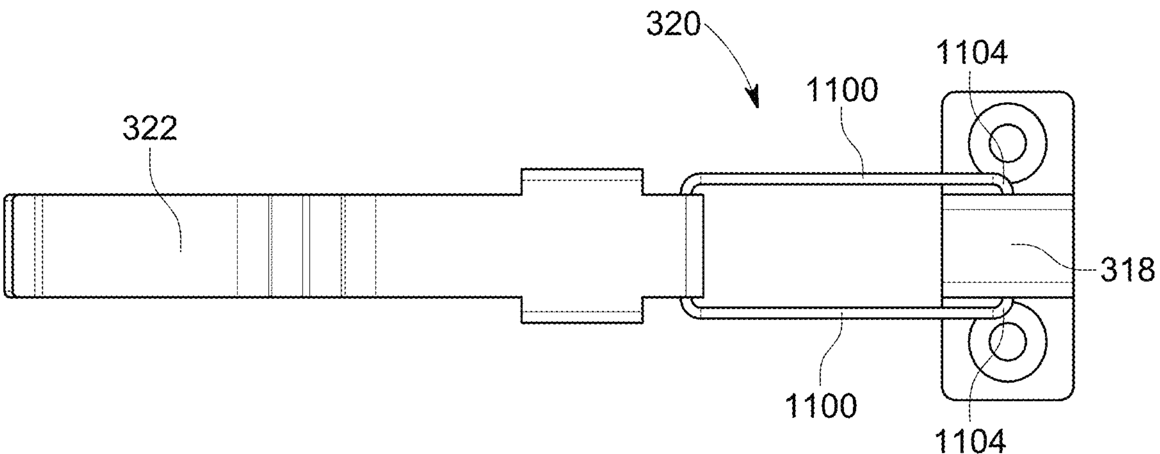
FIG. 12 shows a perspective view of the lever attached to the anchor of the mounting latch of FIG. 3, according to aspects of the present disclosure.
Figure 13:
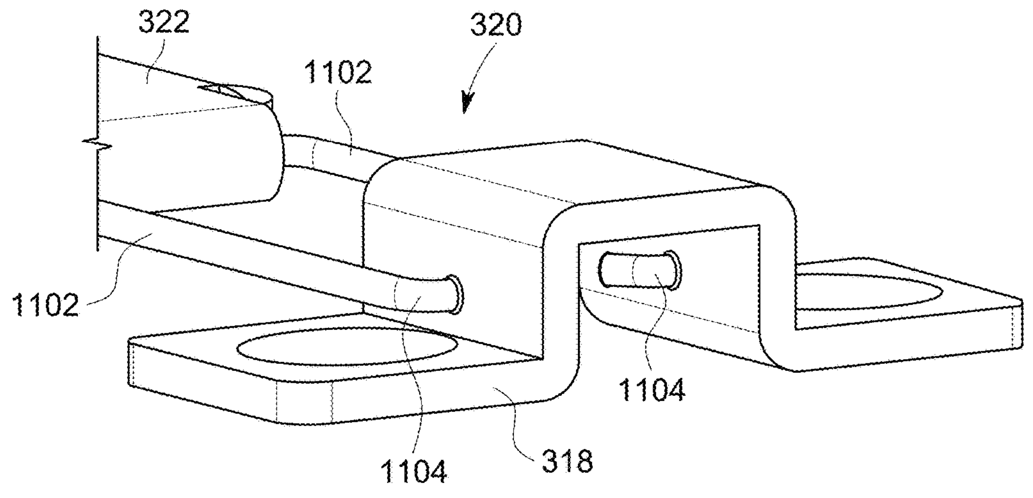
FIG. 13 shows a detailed perspective view of the anchor attached to the rigid arm of the mounting system of FIG. 3, according to aspects of the present disclosure.

Referring to FIG. 11, the rigid arm 320 can be a looped wire or rod that includes arms 1100 that extend from a base 1102. Opposite the base 1102, the arms 1100 can include hooked ends 1104. Referring to FIGS. 12 and 13, the hooked ends 1104 hook into the anchor 318, which retains the rigid arm 320 within the anchor 318.

Figure 14:
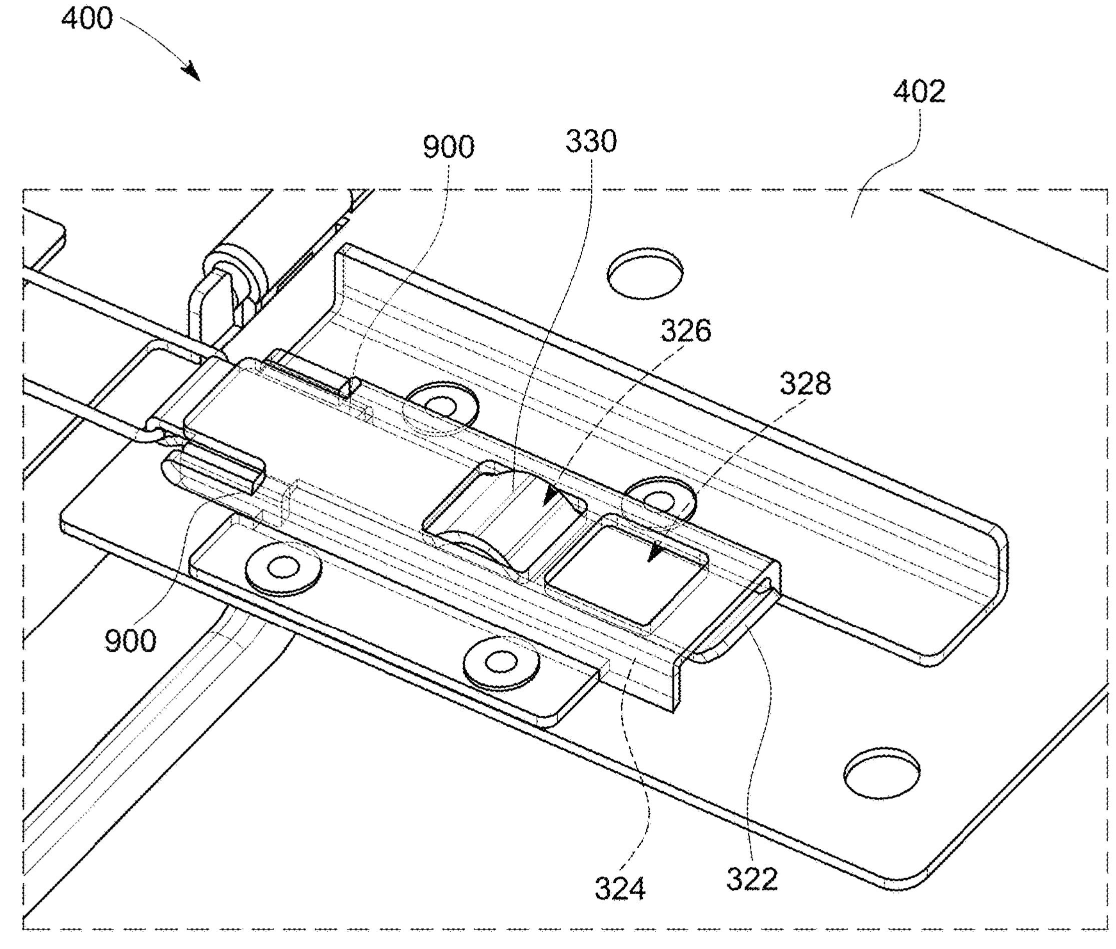
FIG. 14 shows a detailed partial transparent view of the rail and the lever of the mounting latch of FIG. 3, according to aspects of the present disclosure.

Referring to FIG. 14, a detailed partial transparent view of the rail 324 and lever 322 of the mounting latch 300 is shown, according to aspects of the present disclosure. As disclosed above, the lever 322 includes legs 900 that contact the bracket 402. The legs 900 act as fulcrum points for the lever 322, which allows the lever 322 to flex relative to the bracket 402. This allows the projection 330 of the lever 322 to withdraw into the apertures 326 and 328 in the rail 324 so that the lever 322 can translate within the rail 324.

Figure 15:
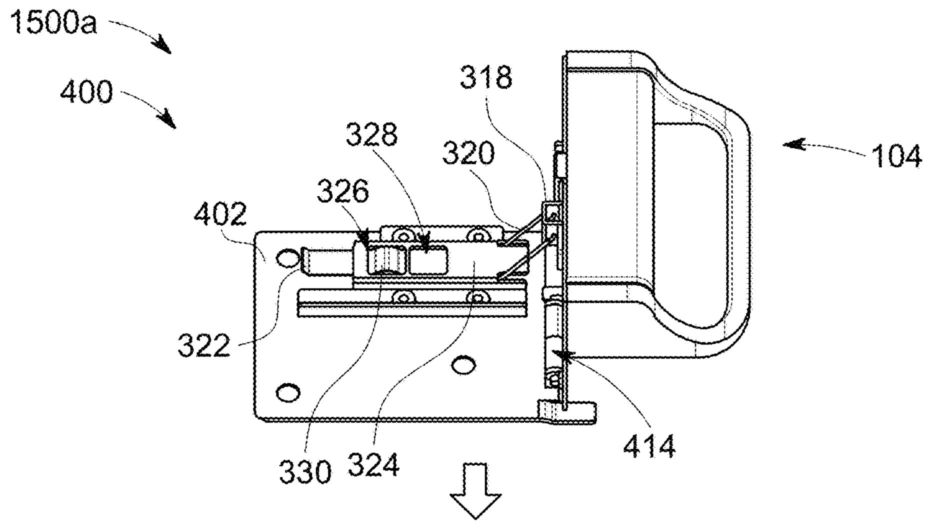
FIG. 15 shows perspective views of stages of operation of the mounting system, according to aspects of the present disclosure.
Figure 15:
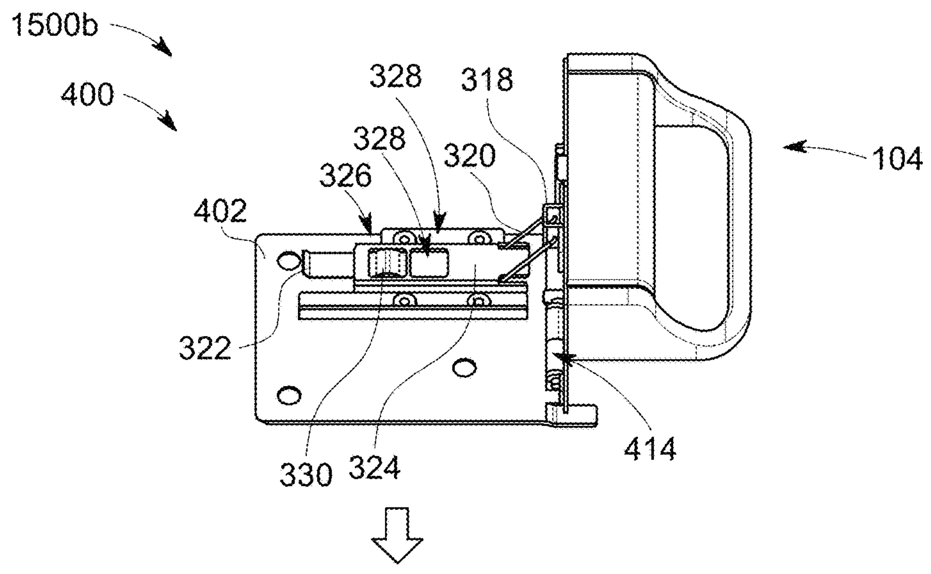
Figure 15:
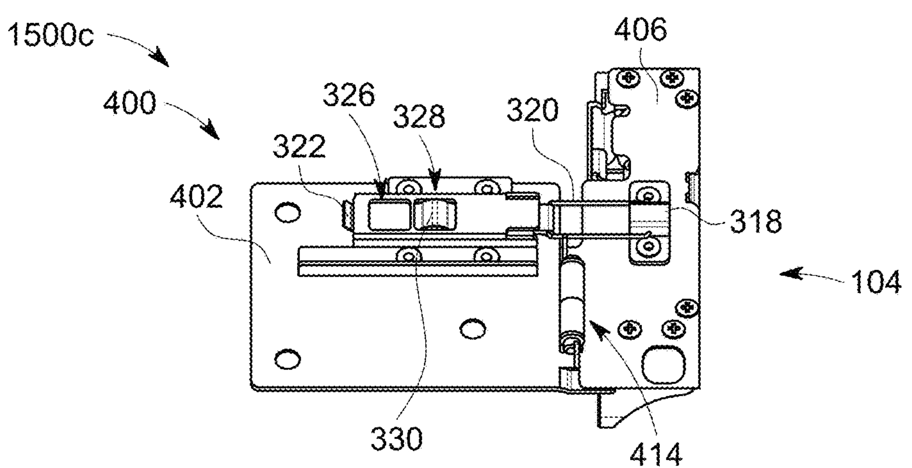

Referring to FIG. 15, shown are stages **1500*a-c* of the mounting system 400 being rotated, according to aspects of the present disclosure. At stage 1500***a*, the second bracket 406 (FIG. 4) of the mounting system 400 is rotated about 90 degrees relative to the first bracket 402. This stage 1500*a* can be considered a first position or an extended arrangement of the mounting system 400. This is because with the mounting system 400 attached to a chassis in the extended arrangement, such as discussed below, the cap 104 attached to the mounting system 400 at the second bracket 406 extends beyond the width of the chassis.

The stage 1500*a* further includes the projection 330 of the lever 322 extending through the aperture 326 of the rail 324. The aperture 326 maintains the projection 330, and therefore the lever 322, in place. The lever 322 connected to the rigid arm 320 maintains the lever 322 in place. The rigid arm 320 connected to the anchor 318 maintains the anchor 318 in place.

With the bracket 406 (FIG. 4) 90 degrees relative to the bracket 402, the right-angled projections 506 and 508 (FIGS. 5 and 6) abut the brackets 406 and 402 (FIGS. 5 and 6), respectively. This overall arrangement generally locks the bracket 406 in the 90 degree angle orientation.

At stage 1500*b* of FIG. 15, the change relative to stage 1500*a* is that the projection 330 is depressed so that the projection 330 no longer extends through the aperture 326.

At stage 1500*c* of FIG. 15, the lever 322 is translated toward the bracket 406. This forces the rigid arm 320 to rotate within the lever 322 and also translate toward the anchor 318 on the bracket 406. This causes the bracket 406 to rotate about the hinge 414. The bracket 406 is planar with the bracket 402. With the bracket 406 planar relative to the bracket 402, the planar projection 510 (FIGS. 5 and 6) abuts the bracket 406. This overall arrangement generally locks the bracket 406 in the planar orientation.

This stage 1500*c* can be considered a second position or a retracted arrangement of the mounting system 400. This is because with the mounting system 400 attached to a chassis in the retracted arrangement, such as discussed below, the cap 104 attached to the mounting system 400 at the second bracket 406 is retracted within the width of the chassis.

Figure 16:
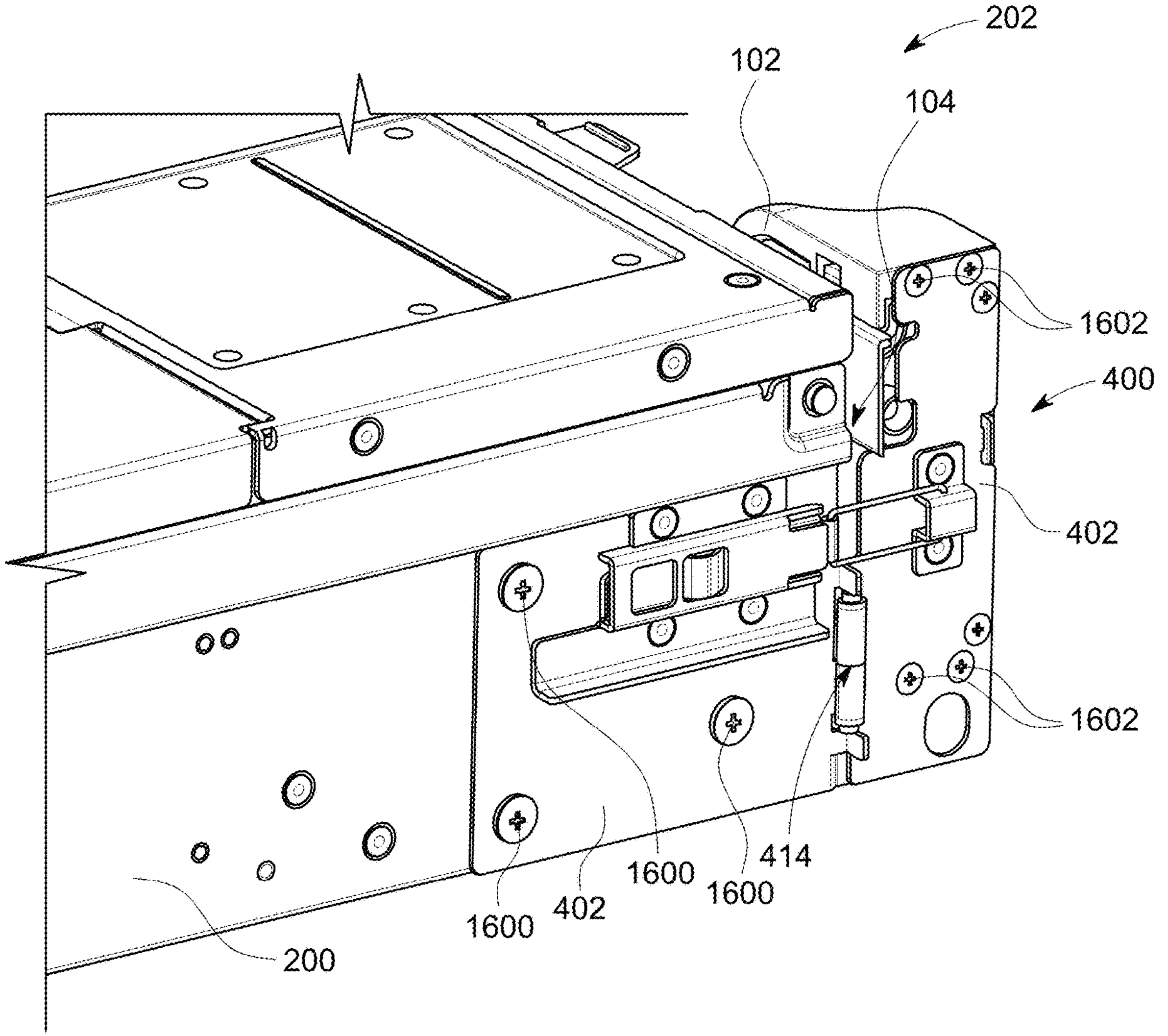
FIG. 16 shows a partial perspective view of the mounting system attached to an ear and a chassis, according to aspects of the present disclosure.

FIG. 16 shows a partial perspective view of the mounting system 400 attached to a cap 104 and a chassis 200, according to aspects of the present disclosure. Fasteners 1600, such as screws, attach the bracket 402 of the mounting system 400 to the chassis 200. Fasteners 1602, such as screws, attach the bracket 406 of the mounting system 400 to the PCB 104. The mounting system 400 is shown in FIG. 16 in the retracted arrangement, such as that shown in stage 1500*c* in FIG. 15.

Figure 17:
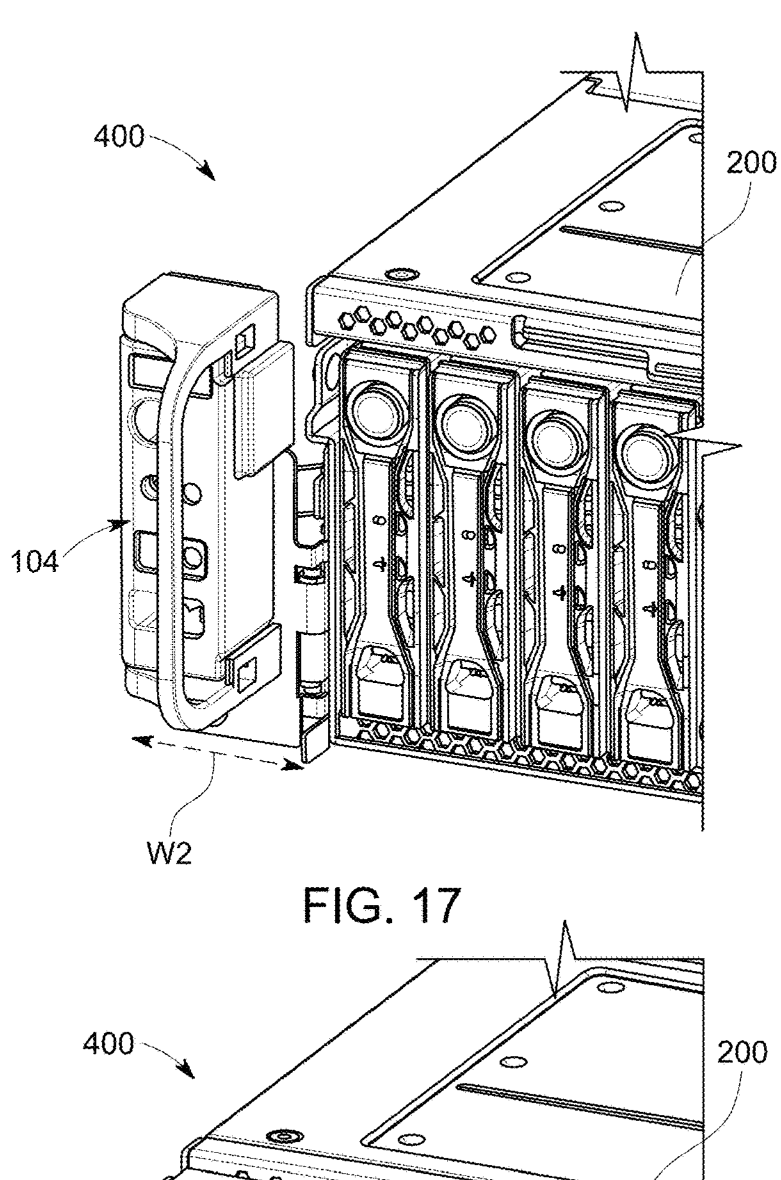
FIG. 17 shows a partial perspective view of the mounting system in an extended arrangement, according to aspects of the present disclosure.

FIG. 17 shows a partial perspective view of the mounting system 400 connected to a chassis 200 in an extended arrangement, according to aspects of the present disclosure. The cap 104 extends beyond the width of the chassis 200 by the width W2. The same arrangement exists on the opposite side of the chassis 200. Thus, the cap 104 substantially extend the width of the chassis 200.

Figure 18:
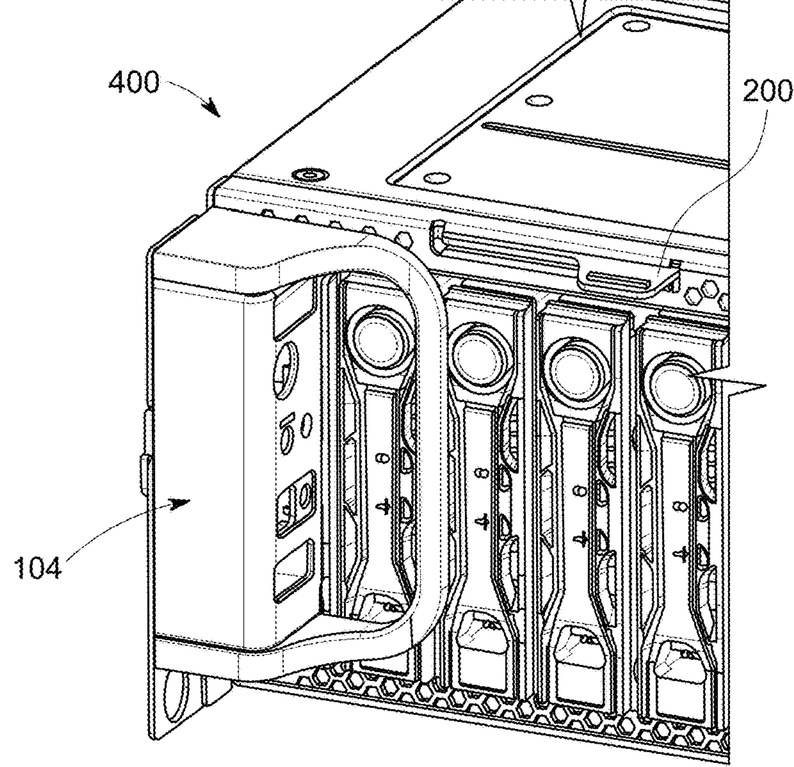
FIG. 18 shows a partial perspective view of the mounting system in a retracted arrangement, according to aspects of the present disclosure.

FIG. 18 shows a partial perspective view of the mounting system 400 in a retracted arrangement, according to aspects of the present disclosure. In the retracted arrangement, the cap 104 no longer extends beyond the width of the chassis by the width W2, which allows the chassis to fit into various arrangement that are not possible with conventional mounting ears. For example, the retracted ear allows the chassis 200 to be inserted into an emersion cooling system.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A computing system comprising:

a server chassis having a side wall defining an outer periphery of an internal chassis area that is configured for receiving a server;

a mounting ear including a cap covering a printed circuit board (PCB), the mounting ear further including a handle for user operation, the mounting ear being configured for facilitating securing the server chassis in a server rack; and a mounting system including:

a first bracket rotatably connected to a second bracket via a hinge, the first bracket being fixed to the side wall, the mounting ear being fixed to the second bracket;

an anchor attached to the second bracket;

a rail attached to the first bracket;

a rigid arm connected to the anchor; and a lever positioned within the rail and connected to the anchor via the rigid arm, wherein the lever is configured to translate within the rail between a first position and a second position, the rigid arm being positioned in the first position relative to the anchor such that the second bracket can rotate to a planar position relative to the first bracket, the rigid arm being positioned in the second position relative to the anchor such that the rigid arm secures the second bracket in a perpendicular position relative to the first bracket;

wherein, in the first position, the handle is perpendicular to the first bracket and extends in a direction from the side wall towards the internal chassis area;

wherein, in the second position, the handle is parallel to the first bracket and extends in a direction from the side wall away from the internal chassis area.

2. The computing mounting system of claim 1, wherein the rail includes a first aperture and a second aperture, the first aperture being closer to the anchor than the second aperture.

3. The computing mounting system of claim 2, wherein the lever includes a projection that is configured to selectively extend through the first aperture and the second aperture.

4. The computing mounting system of claim 3, wherein the projection extending through the first aperture secures the lever in the first position, and the projection extending through the second aperture secures the lever in the second position.

5. The computing mounting system of claim 4, wherein the lever includes two legs upon which the lever rides within the rail, the two legs acting as a fulcrum when depressing the projection.

6. The computing mounting system of claim 1, wherein the first bracket includes a first cylindrical hole, and the second bracket includes a second cylindrical hole, the mounting system further comprising:

a pin slotted through the first cylindrical hole and the second cylindrical hole to form the hinge.

7. The computing mounting system of claim 6, further comprising a pair of fasteners configured to secure the pin within the hinge.

8. The computing mounting system of claim 1, wherein the first bracket includes a right-angled projection configured to abut against the second bracket, the right-angled projection limiting rotation of the second bracket relative to the first bracket.

9. The computing mounting system of claim 1, wherein the second bracket includes a right-angled projection configured to abut against the first bracket, the right-angled projection limiting rotation of the second bracket relative to the first bracket.

10. The computing mounting system of claim 1, wherein the first bracket includes a planar projection configured to abut against the second bracket, the planar projection limiting rotation of the second bracket relative to the first bracket.

11. The computing mounting system of claim 1, wherein the first bracket includes one or more apertures that align with apertures on a chassis.

12. The computing mounting system of claim 1, wherein the second bracket includes one or more apertures that align with apertures on a mounting ear.

13. The computing mounting system of claim 1, further comprising a protection flange attached to the first bracket, the protection flange extending parallel to the rail and being taller than the lever within the rail.

14. A computing system comprising:

a blade server chassis having a side wall defining an outer periphery of an internal chassis area that is configured for receiving a server, a mounting ear including a handle for user operation; and a mounting system coupling the mounting ear to the blade server chassis, the mounting system comprising:

a first bracket fixed to the side wall of connected to the blade server chassis; and a second bracket fixed connected to the mounting ear;

wherein the first bracket is connected to the second bracket to allow the second bracket to rotate relative to the first bracket between a first position and a second position such that the mounting ear is withdrawn within a width of the blade server chassis;

wherein, in the first position, the handle is perpendicular to the first bracket and extends in a direction from the side wall towards the internal chassis area; and wherein, in the second position, the handle is parallel to the first bracket and extends in a direction from the side wall away from the internal chassis area.

15. The computing system of claim 14, wherein the first bracket and the second bracket are connected together by a hinge, the hinge being configured to allow the second bracket to rotate relative to the first bracket.

16. The computing system of claim 15, wherein the mounting system further comprises:

a rail attached to the first bracket;

a rigid arm connected to the anchor; and a lever within the rail and connected to the anchor by the rigid arm.

17. The computing system of claim 16, wherein the lever is configured to translate within the rail between the first position and the second position, the first position positioning the rigid arm relative to the anchor such that the second bracket can rotate to be planar to the first bracket, the second position positioning the rigid arm relative to the anchor such that rigid arm secures the second bracket to be perpendicular to the first bracket.

18. The mounting system of claim 17, wherein the rail includes a first aperture and a second aperture, the first aperture being closer to the anchor than the second aperture, the lever including a projection that is configured to selectively extend through the first aperture and the second aperture.

19. The mounting system of claim 18, wherein the second bracket includes a right-angled projection configured to abut against the first bracket, the right-angled projection limiting rotation of the second bracket relative to the first bracket.

20. The mounting system of claim 19, wherein the first bracket includes a planar projection configured to abut against the second bracket, the planar projection limiting rotation of the second bracket relative to the first bracket.

* * * * *